(12) United States Patent
Kim et al.

(10) Patent No.: US 8,644,092 B2
(45) Date of Patent: Feb. 4, 2014

(54) MULTI-CHIP PACKAGE AND METHOD OF OPERATING THE SAME

(75) Inventors: Kyoung Nam Kim, Gyeonggi-do (KR); Beom Ju Shin, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 124 days.

(21) Appl. No.: 13/243,223

(22) Filed: Sep. 23, 2011

(65) Prior Publication Data

US 2012/0140577 A1  Jun. 7, 2012

(30) Foreign Application Priority Data

Dec. 3, 2010 (KR) .......................... 10-2010-0122905

(51) Int. Cl.
*G11C 7/06* (2006.01)
(52) U.S. Cl.
USPC ...................... 365/189.07; 365/201
(58) Field of Classification Search
USPC .............. 365/185.12, 189.07, 201, 220
See application file for complete search history.

(56) References Cited

U.S. PATENT DOCUMENTS

| | | | | |
|---|---|---|---|---|
| 5,661,729 A | * | 8/1997 | Miyazaki et al. | ............. 714/719 |
| 7,466,577 B2 | * | 12/2008 | Sekiguchi et al. | ............. 365/51 |
| 7,843,758 B2 | * | 11/2010 | Byeon | ...................... 365/230.05 |
| 2003/0037295 A1 | * | 2/2003 | Galzur et al. | ................ 714/719 |
| 2005/0185485 A1 | * | 8/2005 | Saitoh et al. | ................ 365/201 |
| 2008/0298147 A1 | * | 12/2008 | Matsui | .......................... 365/201 |

FOREIGN PATENT DOCUMENTS

| | | |
|---|---|---|
| KR | 1020010037848 | 5/2001 |
| KR | 1020040020143 | 3/2004 |
| KR | 1020050071805 | 7/2005 |
| KR | 1020100122905 | 11/2010 |

OTHER PUBLICATIONS

Office Action issued from the Korean Intellectual Property Office on Apr. 27, 2012.
Notice of Allowance issued by the Korean Intellectual Property Office on Nov. 28, 2012.

* cited by examiner

*Primary Examiner* — Son Dinh
*Assistant Examiner* — Uyen B Tran
(74) *Attorney, Agent, or Firm* — IP & T Group LLP

(57) ABSTRACT

A semiconductor memory device includes a memory cell array including first memory cells for storing data and second memory cells for storing chip identification (ID) information, a data comparison circuit configured to compare input data and the stored data of the first memory cells and to output comparison data, and output circuits configured to output the comparison data received in parallel from the data comparison circuit. The comparison data is outputted through a selected one of the output circuits according to an enable signal generated based on the chip ID information.

28 Claims, 8 Drawing Sheets

FIG. 2
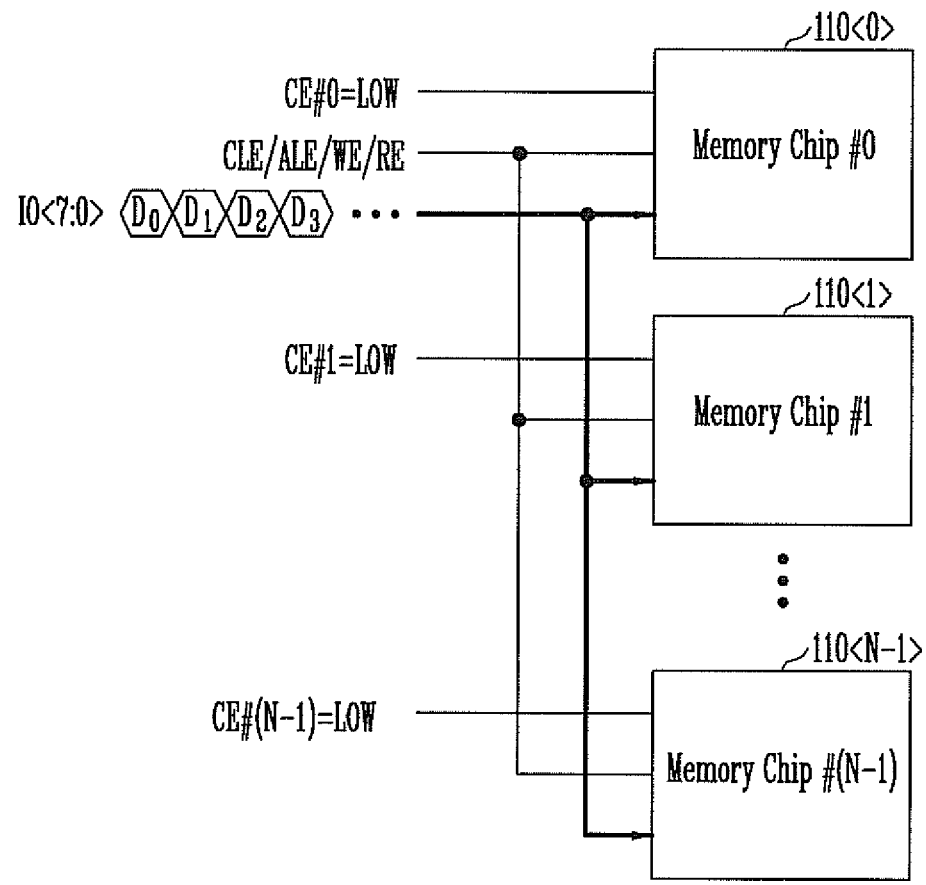
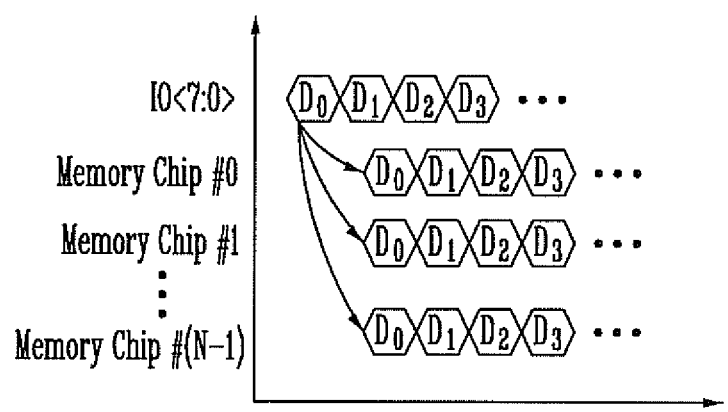

MULTI-CHIP PACKAGE AND METHOD OF OPERATING THE SAME

CROSS-REFERENCE TO RELATED APPLICATION

Priority to Korean patent application number 10-2010-0122905 filed on Dec. 3, 2010, the entire disclosure of which is incorporated by reference herein, is claimed.

BACKGROUND

Exemplary embodiments relate to a multi-chip package and, more particularly, to a stack-type multi-chip package for performing a test operation.

In increasing the integration degree of memory chips, the memory chips may be stacked. For example, 2, 4, or 8 memory chips are stacked in order to increase the integration degree of the memory chips.

Meanwhile, in a process of fabricating memory products, such as flash memory devices, the operations of memory cells for storing information are to be tested in order to check whether the memory cells have proper operating characteristics.

In general, the test operation of the memory cells is performed by comparing data, inputted to the memory cells, and data outputted from the memory cells.

In testing a device in which memory chips are stacked, each of the memory chips is to be tested. Here, the test time is increased with an increase in the number of stacked memory chips. In stacked-memory chip devices, it is useful to reduce the time for testing the memory chips.

BRIEF SUMMARY

According to exemplary embodiments of this disclosure, when a test operation for memory chips is performed, an output circuit is allocated to each of the memory chips so that all the memory chips can output data at the same time. Accordingly, the test time taken for a stack-type multi-chip package can be reduced.

A semiconductor memory device according to an aspect of the present disclosure includes a memory cell array including first memory cells for storing data and second memory cells for storing chip identification (ID) information; a data comparison circuit configured to compare input data and the stored data of the first memory cells and to output comparison data; and output circuits configured to output the comparison data received in parallel from the data comparison circuit. The comparison data is outputted through a selected one of the output circuits according to an enable signal generated based on the chip ID information.

A multi-chip package according to another aspect of the present disclosure includes a plurality of memory chips that each have I/O lines. The memory chips compare input data and data outputted from memory cells and output comparison data through a respective one of the I/O lines, wherein different ones of the I/O lines are selected for different ones of the memory chips based on chip identification (ID) information.

A method of operating a multi-chip package according to yet another aspect of the present disclosure includes inputting input data to a plurality of memory chips through input circuits of the memory chips in parallel; performing a program operation for storing the input data in the memory cells of the memory chips; performing a read operation for reading the stored data of the memory cells; outputting comparison data obtained by comparing the input data with the stored data of the memory cells through output circuits for the memory chips, wherein different ones of the output circuits are selected for different ones of the memory chips, respectively; and determining whether a test operation for each of the memory chips is a pass or a fail based on the outputted data.

BRIEF DESCRIPTION OF THE DRAWINGS

FIG. 2 is a diagram illustrating parallel data input to the multi-chip package according to an exemplary embodiment of this disclosure;

DESCRIPTION OF EMBODIMENTS

Hereinafter, exemplary embodiments of the present disclosure will be described in detail with reference to the accompanying drawings, which are provided to enable a person of ordinary skill in the art to make and use the exemplary embodiments of the disclosure.

Figure 1:
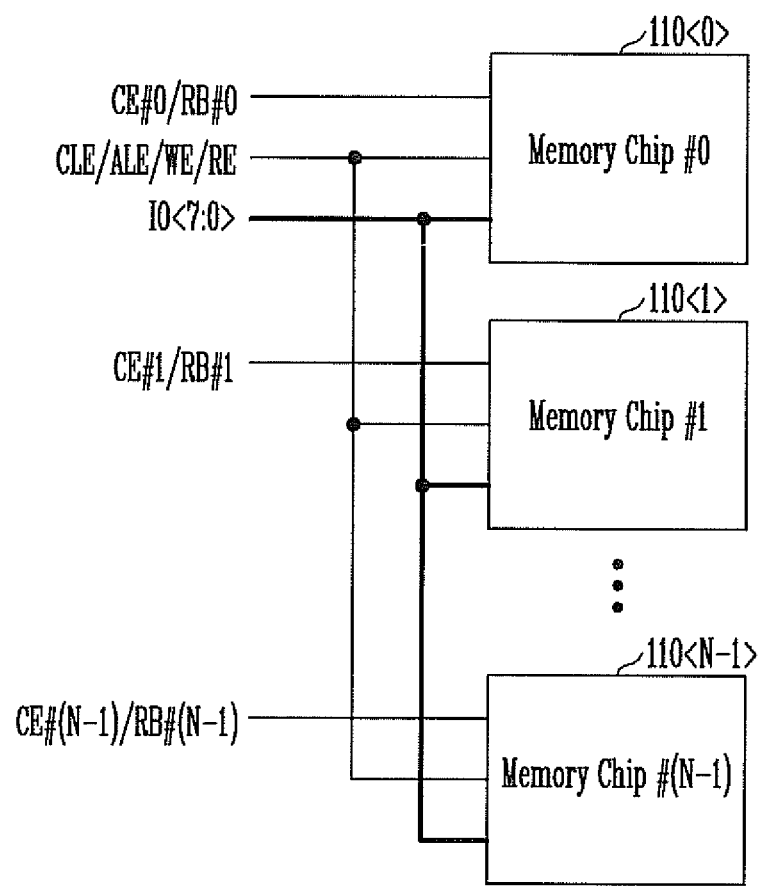
FIG. 1 is a diagram showing a configuration of the pins of a multi-chip package according to an exemplary embodiment of this disclosure.

FIG. 1 is a diagram showing a configuration of the pins of a multi-chip package according to an exemplary embodiment of this disclosure.

Referring to FIG. 1, the multi-chip package according to the exemplary embodiment of this disclosure includes N memory chips 110<0> to 110<N−1>. That is, the N memory chips 110<0> to 110<N−1> are stacked.

A chip enable signal and state signal CE#/RB# is used in each of the memory chips. An I/O circuit IO and command pins (for example, CLE, ALE, WE, and RE) are used in common.

Here, a case in which the I/O circuit includes eight terminals is illustrated as an example only, where the number of terminals may vary and the number of stacked memory chips may be changed according to the number of terminals included in the I/O circuit.

In testing the stack-type multi-chip package, each of the memory chips is to be tested. Accordingly, the test time may increase with an increase in the number of stacked memory chips.

FIG. 2 is a diagram illustrating parallel data input to the multi-chip package according to an exemplary embodiment of this disclosure.

Referring to FIG. 2, in the multi-chip package according to the exemplary embodiment of this disclosure, when data is inputted (that is, programmed) to the memory chips 110<0> to 110<n−1> in a test operation, the same data (for example, test data) may be inputted to the memory chips in parallel at the same time.

When the same data is inputted to the memory chips in parallel (for example, at the same time), the test time is not increased in testing the stack-type multi-chip package since the testing is performed in parallel for multiple chips at the same time.

Figure 3:
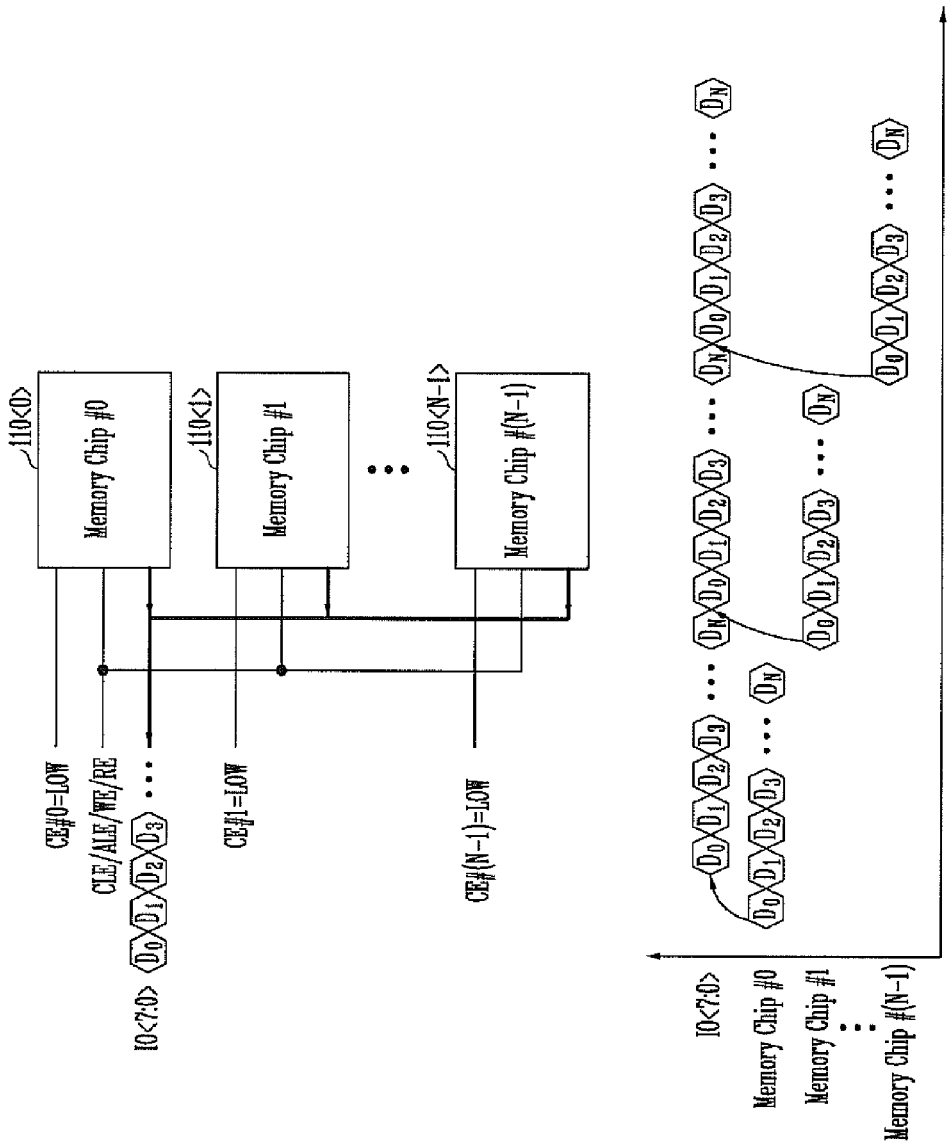
FIG. 3 is a diagram illustrating serial data output from the multi-chip package according to an exemplary embodiment of this disclosure.

FIG. 3 is a diagram illustrating serial data output from the multi-chip package according to an exemplary embodiment of this disclosure.

Referring to FIG. 3, when data is read from the memory chips 110<0> to 110<n−1> of the multi-chip package, the data read from the memory chips is to be sequentially outputted, where the sequentially output data is referred to as serial data output.

Here, an I/O circuit IO (that is, an external I/O circuit) is shared by all the memory chips in inputting/outputting data to/from the memory chips. Thus, when a data read operation for the memory chips 110<0> to 110<n−1> is performed at the same time for multiple memory chips as in a data program operation, the output data of the memory chips will collide with each other at the external I/O circuit. In order to address such a feature, the output data may be sequentially outputted from the memory chips. In such a case, the test time for the multi-chip package increases because of the serial data output.

A multi-chip package for addressing such features of the serial data output method according to an example is described below.

Figure 4:
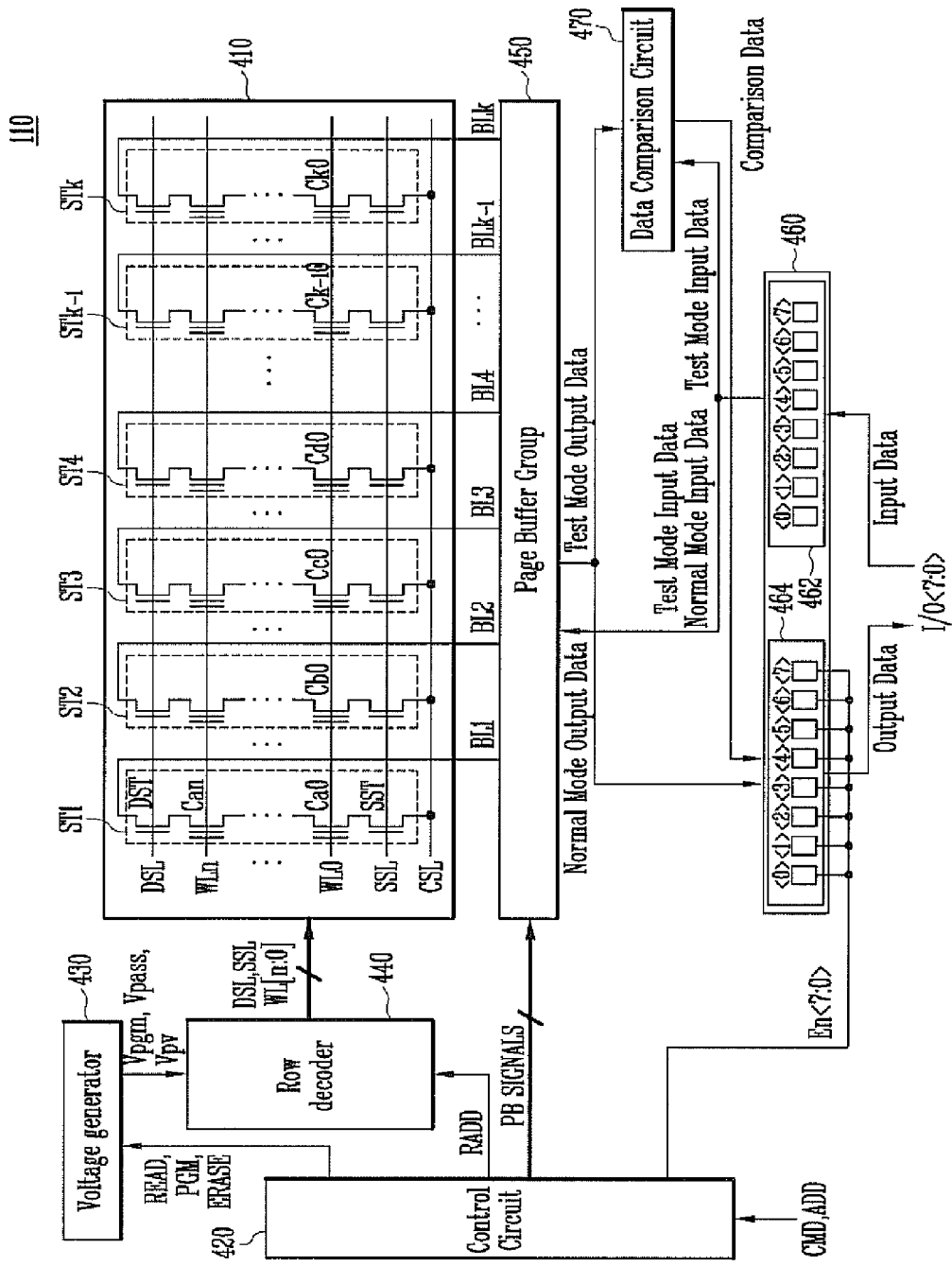
FIG. 4 is a block diagram of a semiconductor memory device according to an exemplary embodiment of this disclosure.
Figure 5:
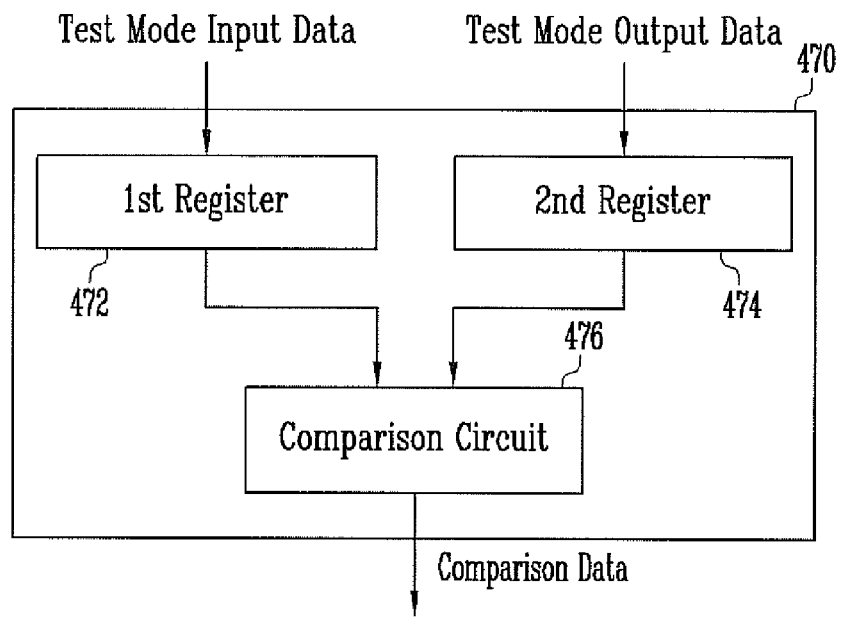
FIG. 5 is a block diagram illustrating a data comparison circuit of FIG. 4.
Figure 6:
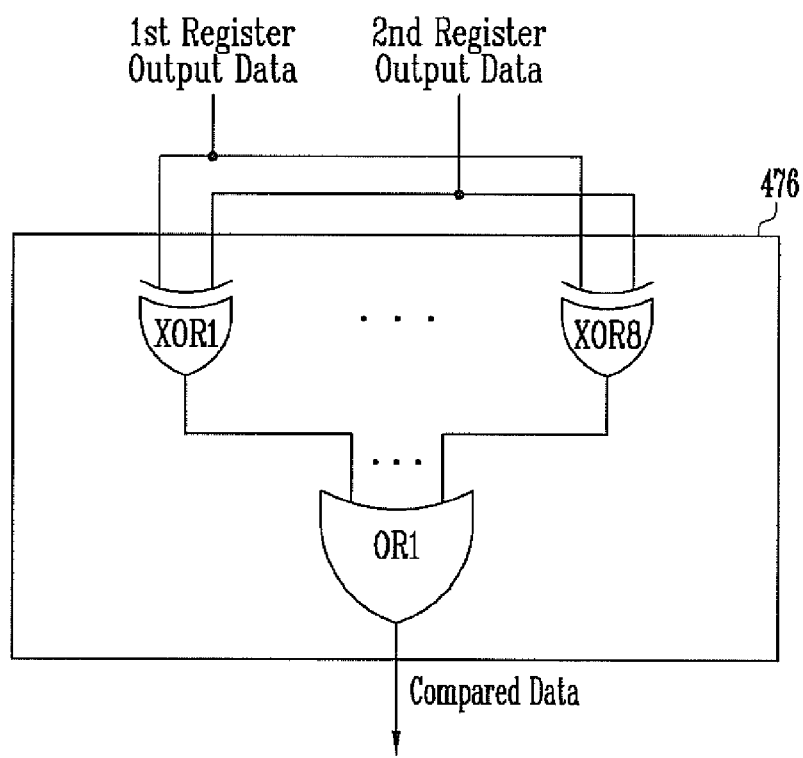
FIG. 6 is a circuit diagram illustrating a comparison circuit of FIG. 5.
Figure 7:
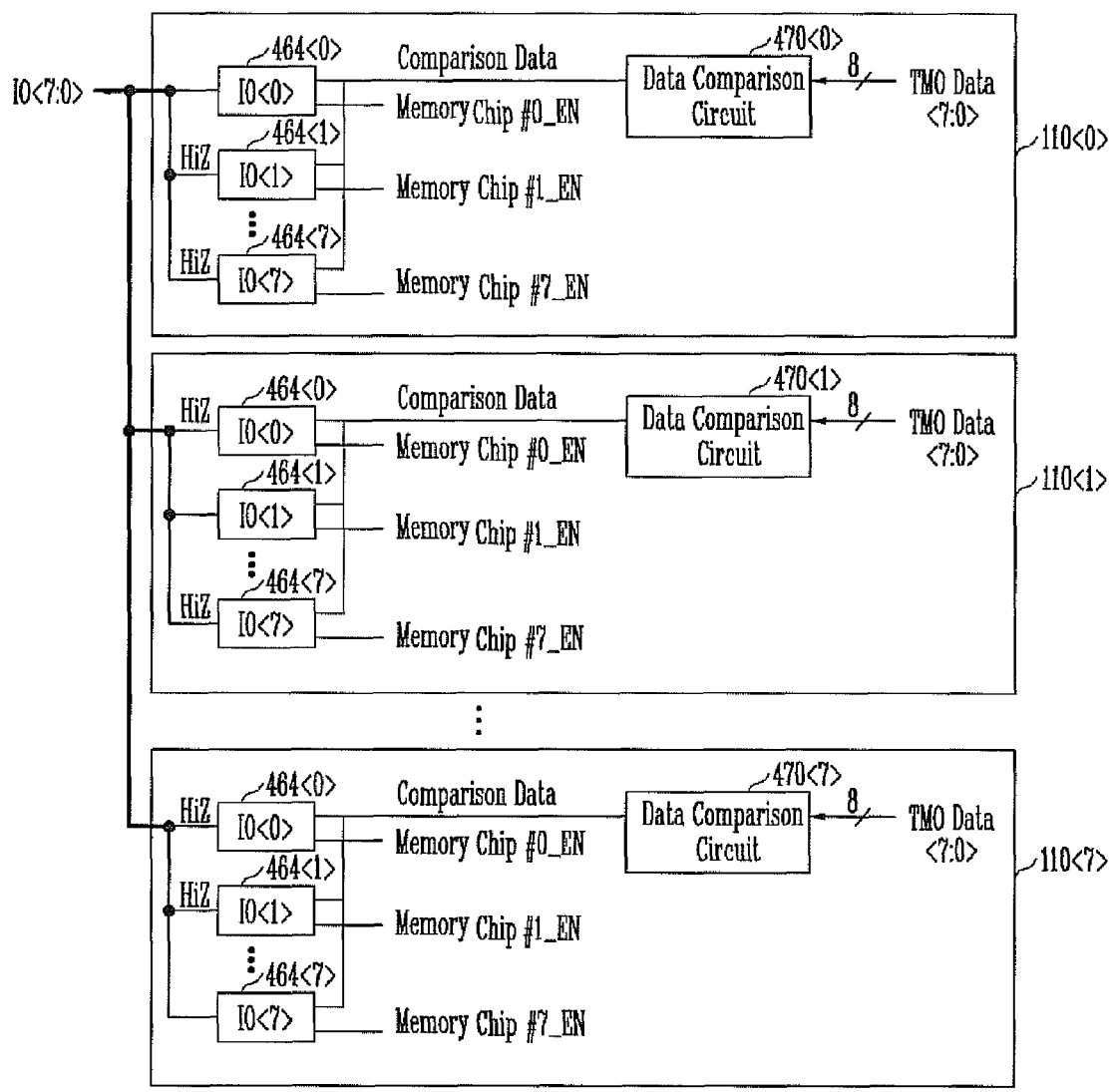
FIGS. 7 and 8 are diagrams illustrating parallel data output from the multi-chip package according to an exemplary embodiment of this disclosure.
Figure 8:
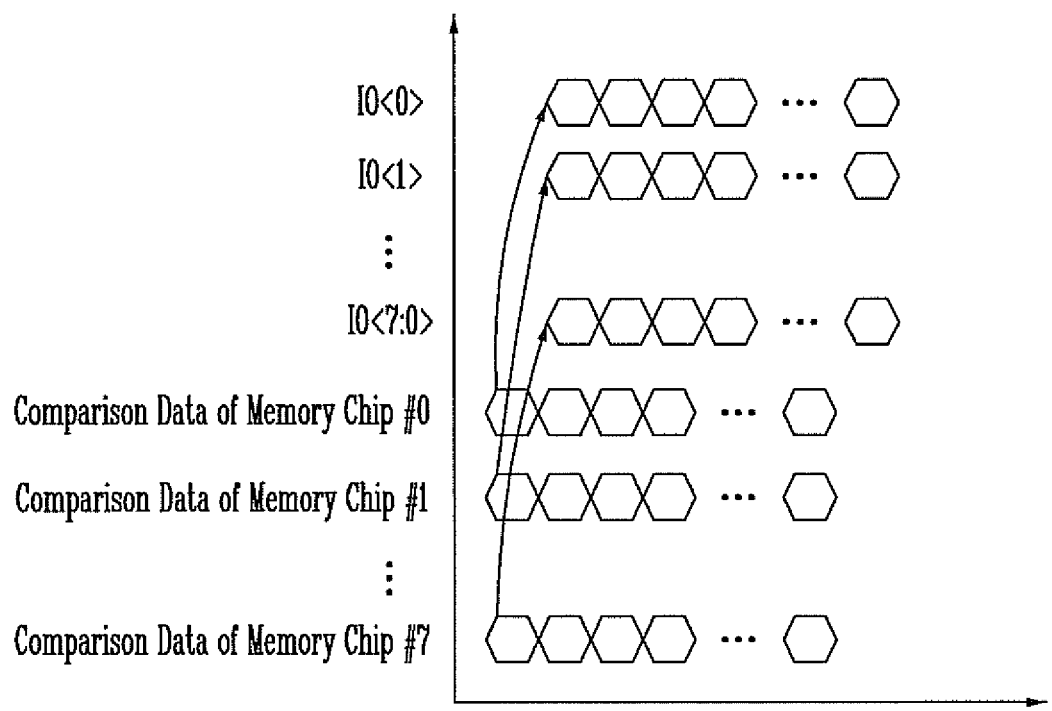

FIG. 4 is a block diagram of a semiconductor memory device according to an exemplary embodiment of this disclosure. FIG. 5 is a block diagram illustrating a data comparison circuit of FIG. 4. FIG. 6 is a circuit diagram illustrating a comparison circuit of FIG. 5. FIGS. 7 and 8 are diagrams illustrating parallel data output from the multi-chip package according to an exemplary embodiment of this disclosure.

Referring to FIGS. 4 and 7, the multi-chip package according to an exemplary embodiment of this disclosure includes a plurality of memory chips 110<0> to 110<7> having internal I/O lines coupled in parallel to external I/O lines, where an example of each memory chip is memory chip 110 shown in FIG. 4. The multi-chip package may further include a controller (not shown).

Each of the memory chips 110<0> to 110<7> compares external input data Input Data and data read from memory cells (that is, test mode output data which is read from memory cells and hereinafter referred to as 'TMO data') and outputs comparison data Compared Data through each I/O line selected based on chip ID information.

The controller may be configured to supply a test operation execution command to the memory chips 110<0> to 110<7>.

Each of the memory chips is a semiconductor memory device and includes a memory cell array 410, a data comparison circuit 470, and an I/O circuit 460. Here, according to an example, I/O circuit may have separate structures for the inputting and the outputting of information, respectively, as shown in FIG. 4. The comparison data is outputted through an output circuit selected in response to an enable signal EN<7:0> and based on chip ID information. The memory chip 110 may further include an operation circuit group including a page buffer group 450, a control circuit 420 and a power supply circuit, 430 and 440.

The memory cell array 410 includes a plurality of memory blocks. FIG. 4 shows an exemplary one of the memory blocks. The exemplary memory block includes first memory cells for storing external input data and second memory cells for storing chip ID information. In an exemplary embodiment, the second memory cells may be implemented using CAM cells. More particularly, the memory block includes a plurality of strings ST0 to STk. Each (for example, ST0) of the strings includes a source select transistor SST having a source coupled to a common source line CSL, a plurality of memory cells Ca0 to Can, and a drain select transistor DST having a drain coupled to a bit line (for example, BL1). The gate of the source select transistor SST is coupled to a source select line SSL. The gates of the memory cells Ca0 to Can are coupled to respective word lines WL0 to WLn. The gate of the drain select transistor DST is coupled to a drain select line DSL. The strings ST1 to STk are coupled to the respective bit lines BL1 to BLk and are commonly coupled to the common source line CSL.

The second memory cells for storing the chip ID information have the same construction as the first memory cells except that information (for example, information pertinent to operating voltages and information about the relative position or sequence of a memory chip within the multi-chip package) relevant for a memory chip operation is stored in the second memory cells.

The control circuit 420 internally generates a program operation signal PGM, a read operation signal READ, or an erase operation signal ERASE in response to a command signal CMD and also generates control signals PB SIGNALS for controlling the operations of page buffers (not shown) of the page buffer group 450 according to different operations. The control circuit 420 further generates a row address signal RADD in response to an address signal ADD.

According to an example, the operation circuit group supplies operating voltages for the program operation, the erase operation, or the read operation of selected memory cells to the drain select line DSL, the word lines WL0 to WLn, and the source select line SSL of a relevant memory block in response to the signals READ, PGM, ERASE, and RADD of the control circuit 420. The voltage generator 430 and row decoder 440 constitute a power supply circuit.

The voltage generator 430 generates the operating voltages for programming, reading, and erasing memory cells to global lines in response to the operation signals PGM, READ, and ERASE (that is, the internal command signals of the control circuit 420) and supplies the operating voltages (for example, Vpgm, Vpass, and Vpv) to global lines coupled to the row decoder 440 when the memory cells are to be programmed.

The row decoder 440 transfers the operating voltages of the voltage generator 430 to the strings ST1 to STk of a selected memory block of memory cell array 410 in response to the row address signals RADD of the control circuit 420. Here, the operating voltages are supplied to the local lines DSL, WL[n:0], and SSL of the selected memory block.

The page buffer group 450 includes the page buffers coupled to the respective bit lines BL1 to BLk and supplies voltages for reading data stored in the memory cells Ca0 to Ck0 through the respective bit lines BL1 to BL4 in response to the control signals PB SIGNALS of the control circuit 420. More particularly, the page buffer group 450 precharges the bit lines BL1 to BLk or latches data stored in the memory cells Ca0 to Ck0, where the stored data is detected in response to a shift in the voltages of the bit lines BL1 to BLk, when the program operation, the erase operation, or the read operation for the memory cells Ca0 to Ck0 is performed. Here, the page buffer group 450 controls its operation so that voltages of the bit lines BL1 to BLk are changed according to data stored in the memory cells Ca0 to Ck0 and detects data stored in the memory cells Ca0 to Ck0 based on the bit line voltages.

The page buffer group 450 outputs test mode output data (TMO data) read from the first memory cells to the data comparison circuit 470. In a normal mode, which is different from a test mode, the page buffer group 450 may output data read from the first memory cells (that is, normal mode output data which is read from the first memory cells and hereinafter referred to as 'NMO data') and outputs the NMO data to the output circuits 464, where the output circuit 464 are also used to transfer comparison data of stored data of first memory cells and input data as will be described later.

The data comparison circuit 470 compares external input data (that is, test mode input data which is hereinafter referred to as 'TMI data') received from input circuits 462 and TMO data read from the first memory cells and outputs comparison data Compared Data as will be further described below. Here, according to an example, the TMO data read from the first memory cells may be TMI data previously input to input circuits 462 as external input data and stored in the first memory cells through the page buffer group 450.

The I/O circuit 460 includes the input circuits 462 and output circuits 464. External input data Input Data is received through the eight input circuits 462<0> to 462<7> at the same time. The eight input circuits 462<0> to 462<7> output the external input data Input Data to the page buffer group 450 and the data comparison circuit 470. When the TMI data outputted from the input circuits 462 is sequentially inputted to the page buffers of the page buffer group 450, the page buffers store the TMI data in their internal latches. The comparison data Comparison Data outputted from the data comparison circuit 470 is inputted to the eight output circuits 464<0> to 464<7> at the same time. The comparison data Comparison Data is outputted as output data Output Data through an output circuit selected from among the eight output circuits 464<0> to 464<7> in response to the enable signal EN<7:0> which is generated based on chip ID information.

When the comparison data Comparison Data of the data comparison circuit 470 is inputted to the output circuits 464<0> to 464<7>, the control circuit 420 generates the enable signal EN<7:0> that selects one of the output circuits based on chip ID information (for example, chip ID information stored in second memory cells) and supplies the generated enable signal to only an output circuit selected from among the output circuits 464<0> to 464<7>. Accordingly, the comparison data Compared Data is outputted through a selected output circuit.

When the external data inputted to the input circuits 462<0> to 462<7> is outputted to the page buffer group 450 and the data comparison circuit 470, the control circuit 420 may output the enable signals EN<7:0> to the input circuits 462<0> to 462<7> in order to enable the input circuits 462<0> to 462<7>. Furthermore, in the normal mode, the control circuit 420 may output the enable signals EN<7:0> to the output circuits 464<0> to 464<7> so that data is outputted through the output circuits 464<0> to 464<7>.

Referring to FIG. 5, the data comparison circuit 470 includes a first register 472, a second register 474, and a comparison circuit 476.

The first register 472 includes a plurality of first latches for storing the TMI data received from the input circuits 462.

The second register 474 includes a plurality of second latches for storing the TMO data outputted from the page buffer group 450.

In the case where data of 8 bits is stored, the number of each of the first latches and the second latches may be 8.

The comparison circuit 476 compares first register output data received from the first latches of the first register 472 and second register output data received from the second latches of the second register 474 (for example, by comparing each bit of the first register with a corresponding bit of the second register for all of the bits of the first register) and outputs the comparison result as the comparison data Compared Data.

Referring to FIG. 6, the comparison circuit 476 includes a plurality of first logic devices XOR1 to XOR8 and a second logic device OR1. The first logic devices XOR1 to XOR8 compare the first register output data of the first latches and the second register output data of the corresponding second latches and output a result of the comparison. The second logic device OR1 outputs the comparison data Compared Data based on the data outputted from the first logic devices.

According to an example, the first logic device may be implemented using an Exclusive OR (XOR) gate. In this case, when the first register output data stored in the first latches is identical with the second register output data stored in the corresponding second latches, data '0' is outputted. If not, data '1' is outputted.

According to an example, the second logic device may be implemented using an OR gate. Thus, only when data outputted from the first logic devices are all 0, the comparison data Compared Data of 0 is outputted. When any one of the data outputted from the first logic devices is 1, the comparison data Compared Data of '1' is outputted. Accordingly, when all the first register output data stored in the first latches are identical with the second register output data stored in the second latches (that is, only when a test operation is a pass), the comparison data Compared Data of '0' is outputted. Accordingly, whether a test operation for a memory chip is a pass or a fail may be determined based on the comparison data Compared Data.

Referring to FIG. 7, in the multi-chip package according to the exemplary embodiment of this disclosure, when a test operation is performed, an output circuit selected from among the plurality of output circuits IO<0> to IO<7> is allocated to one of the memory chips, and comparison data Comparison Data is outputted. The comparison data Comparison Data is outputted through only the selected output circuit by separately treating the comparison data outputted through the output circuits IO<0> to IO<7>. Accordingly, data collision between each other may be avoided.

For example, in the test operation for the memory chips, comparison data Comparison Data stored in the first memory chip 110<0> is externally outputted through the first output circuit IO<0>, and comparison data Compared Data stored in the second memory chip 110<1> is outputted through the second output circuit IO<1>. Thus, collision between data outputted through the memory chips may be prevented, and all memory chips may output data at the same time without data collision.

A method of outputting comparison data through an output circuit selected in the memory chips of the multi-chip package according to the exemplary embodiment of this disclosure is described below.

First, a command to execute a test operation for the memory chips 110<0> to 110<7> and a command to read data from the second memory cells of each of the memory chips 110<0> to 110<7> (an example in which the second memory cells are CAM cells) are hereinafter described. When the second memory cells are CAM cells and the command to read data from the second memory cells corresponds to a CAM read command is received from the external controller, after the booting of the memory chips 110<0> to 110<7>, a CAM read operation is performed. The CAM read operation is performed to read data stored in the CAM cells. The CAM cell, as described above, stores information about the initial operation of each of the memory chips. Accordingly, the control circuit 420 may obtain information for properly performing the operation of a relevant memory chip through the CAM read operation. To this end, the control circuit 420 may include a register for storing the relevant information.

More particularly, prior to the execution of the test operation for the memory chips, ID information about the memory chip is stored in the CAM cell as data. According to an example, to indicate the relative position/location of each memory chip within the multi-chip package, ID information data is stored in the CAM cell, where the ID information data has an address indicating the relative position of the respective memory chip within the multi-chip package.

For example, in the case of the I/O circuit of 8 bits, data may be stored in the CAM cells corresponding to $0^{th}$ to seventh addresses. If the data stored in the $0^{th}$ address is 1 and the data stored in the first to seventh addresses are 0, the control circuit of the memory chip may determine that the relevant memory chip is a $0^{th}$ memory chip through the CAM read operation. Likewise, if the data stored in the 1st address is 1 and the data stored in the $0^{th}$ and the second to seventh addresses are 0, the control circuit of the memory chip may determine that the relevant memory chip is a first memory chip through the CAM read operation.

After the control circuit determines the relative position of a relevant memory chip within the multi-chip package as described above, the control circuit activates, for example, only one output circuit corresponding to the relative position (that is, the first output circuit IO<0> in the case of the first memory chip 110<1>). To this end, the control circuit generates the enable signal MEMORY CHIP#0_EN of a high level for activating the first output circuit IO<0>, but does not activate the remaining enable signals MEMORY CHIP#1_EN to MEMORY CHIP#7_EN. The second to eighth output circuit IO<1:7> to which the activated enable signals are not supplied remain in a floating state HiZ.

As described above, each of the data comparison circuits 470<0> to 470<7> includes the first and second registers 472 and 474. Accordingly, when a test operation is performed, the first and second registers store external input data inputted to a relevant memory chip and data stored in the memory cells of the memory chip which is the previously stored external input data. Thus, data externally received before being programmed into the memory cells and data read from the memory cells are stored in the first and the second registers. According to an example, the data stored in each of the registers is data of 8 bits. The data comparison circuits 470<0> to 470<7> compare the two data on a bit by bit basis and output comparison data Comparison Data of 1 bit based on the comparison.

According to an example, in a test operation for the memory chip, if data '1' for all 8 bits has been inputted as test data for each data comparison circuit, but data '1' has been outputted from memory cells for all 8 bits, the data comparison circuits 430<0> to 430<7> output data '1'. If the output data is not 1 (that is, if there is any data '0') for all 8 bits, the data comparison circuits 470<0> to 470<7> each output data '0'.

As described above, the data comparison circuits 470<0> to 470<7> each receive data of 8 bits and output comparison data Comparison Data of 1 bit according to an example.

The comparison data Comparison Data is outputted through only though one output circuit (for example, the first output circuit IO<0) activated in response to an enable signal (for example, the enable signal MEMORY CHIP#0_EN).

Here, when a normal operation is performed and a test operation is not performed, the data comparison circuits 470<0> to 470<7> of each of the memory chips 110<0> to 110<7> each combines internal data of 8 bits into one bit data and outputs the one bit data through a corresponding output circuit. Here, only one relevant output circuit is activated, and output terminals of the remaining seven other output circuits are controlled to remain in the floating state HiZ.

Accordingly, when a test operation for a memory chip is performed, only one output circuit, for example, is allocated to each memory chip and all memory chips output data at the same time in parallel. Accordingly, the test time for a stack-type multi-chip package is reduced.

Referring to FIG. 8, comparison data outputted from the data comparison circuit 470 of each of the memory chips is outputted through a corresponding output circuit, and the combined comparison data may be read in parallel. Accordingly, the test time is reduced.

Figure 9:
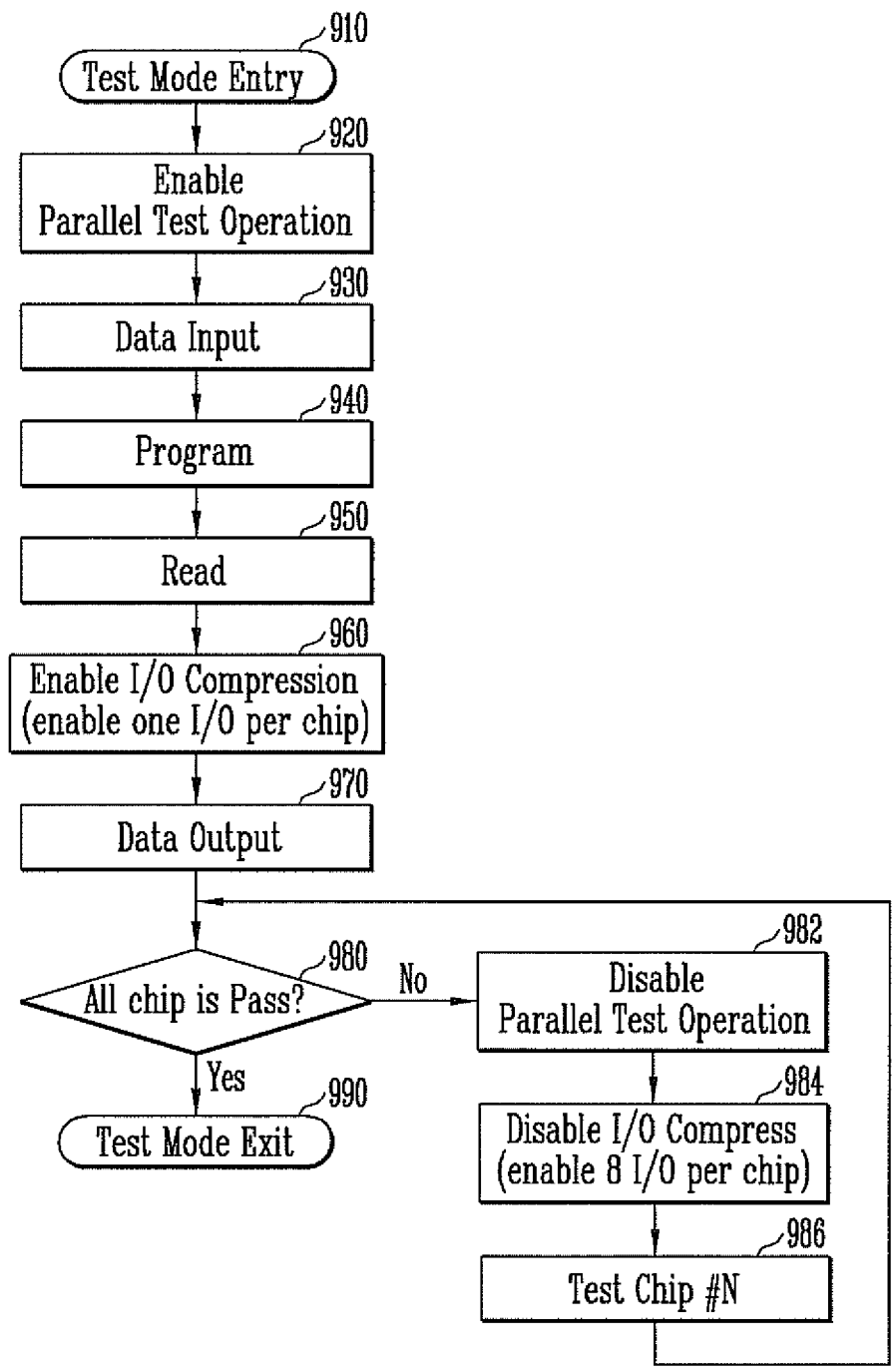
FIG. 9 is a flowchart illustrating a method of operating the multi-chip package according to an exemplary embodiment of this disclosure.

FIG. 9 is a flowchart illustrating a method of operating the multi-chip package according to an exemplary embodiment of this disclosure.

Referring to FIG. 9, in the method of operating the multi-chip package according to the exemplary embodiment of this disclosure, first, a test mode is entered at step 910. To this end, an external controller supplies a test operation command to each of the memory chips.

Next, the controller enables the test operations to be performed in parallel at step 920 by, for example, providing the enable signal En<7:0> in FIG. 4.

Data is inputted to the memory chips through the plurality of input circuits at step 930. A program operation for storing the inputted data in the memory cells is then performed at step 940 by, for example, using the page buffer group 450 in FIG. 4.

Next, a read operation for reading the test data stored in the memory cells is performed at step 950.

Next, comparison data is outputted through a corresponding output circuit of each memory chip (that is, an output circuit corresponding to the relative position of the memory chip within the multi-chip package). Here, the test data inputted during the test operation is compared with the previously stored test data as outputted from the memory cells, and the comparison data is outputted in the form of a one bit comparison data at step 960. Since only one output circuit corresponding to the relative position of the memory chip within the multi-chip package is activated for the memory chip, the comparison data is outputted through the corresponding output circuit at step 970.

At step 980, it is then determined whether the test operation for all memory chips is a pass. If, as a result of the determination, the test operation for all memory chips is determined to be a pass, the test mode is terminated at step 990.

If, as a result of the determination, the test operation for all memory chips is determined not to be a pass (that is, when there is a failed memory chip), the controller disables the mode in which the test operations are performed in parallel at step 982 and individually performs the test operation for determining the failed memory chip.

That is, comparison data is not outputted, and data is outputted through all output circuits of each memory chip in parallel at step 984 without being compressed into one bit data as discussed before. Accordingly, the test operation for each individual memory chip is performed at step 986 for one chip at a time.

It is then determined whether the test operation for all memory chips is a pass at step 980. If, as a result of the determination, the test operation for all memory chips is determined to be a pass, the test mode is terminated at step 990. If there is a failed memory chip, the steps 982 to 986 are repeatedly performed. The above-described steps in FIG. 9 may be performed through, for example, the memory chips 110 in FIG. 4.

As described above, the exemplary embodiments of this disclosure has an advantage in that the test time for a stack-type multi-chip package may be reduced.

That is, in memory chips including CAM cells, information about each memory chip (for example, ID information) is stored in the CAM cell in the form of data, and the data stored in the CAM cell is read upon booting of the memory chips. When a test operation for the memory chips is performed, a corresponding output circuit is allocated to each memory chip based on the data stored in the CAM cell (for example, ID information), and comparison data is outputted through all memory chips at the same time in parallel. Accordingly, the test time for the stack-type multi-chip package is reduced.

Exemplary embodiment may be applied to semiconductor circuits or other applications that use a stack-type multi-chip package.

The exemplary embodiments of this disclosure are not implemented by an apparatus and a method only but also a program for performing the above-described operations of the exemplary embodiments of this disclosure and a recording medium in which the program is stored. Implementations thereof should be apparent to a person having ordinary skill in the art based on the description of the exemplary embodiments.

What is claimed is:

1. A semiconductor memory device, comprising:
    a memory cell array including first memory cells for storing data and second memory cells for storing chip identification (ID) information;
    a data comparison circuit configured to compare input data and the stored data of the first memory cells and to generate comparison data; and
    output circuits configured to output the comparison data received from the data comparison circuit,
    wherein the comparison data is outputted through an output circuit selected by an enable signal generated based on the chip ID information, from among the output circuits.

2. The semiconductor memory device of claim 1, further comprising a page buffer group configured to store the input data and the chip ID information for being stored in the first and second memory cells or to store data outputted from the first and second memory cells and to output the data, outputted from the first memory cells, to the data comparison circuit.

3. The semiconductor memory device of claim 1, further comprising a control circuit configured to generate the enable signal and output the enable signal to the selected output circuit.

4. The semiconductor memory device of claim 3, wherein the control circuit is configured to output the enable signal to input circuits so that the input data is outputted to the page buffer group and the data comparison circuit.

5. The semiconductor memory device of claim 3, wherein in a normal mode of the semiconductor memory device, the control circuit is configured to output the enable signal to the output circuits.

6. The semiconductor memory device of claim 2, further comprising input circuits configured to receive the input data in parallel and to output the input data to the page buffer group and the data comparison circuit.

7. The semiconductor memory device of claim 6, further comprising a control circuit configured to generate the enable signal and output the enable signal to the selected output circuit.

8. The semiconductor memory device of claim 7, wherein the control circuit is configured to output the enable signal to input circuits so that the input data is outputted to the page buffer group and the data comparison circuit.

9. The semiconductor memory device of claim 2, wherein in a normal mode of the semiconductor memory device, the page buffer group is configured to output the data outputted from the first memory cells to the output circuits.

10. The semiconductor memory device of claim 7, wherein in a normal mode of the semiconductor memory device, the control circuit is configured to output the enable signal to the output circuits.

11. A multi-chip package, comprising:
    a plurality of memory chips each having internal I/O lines coupled in parallel to external I/O lines,
    wherein each memory chip is configured to compare first data inputted through the external I/O lines and the internal I/O lines and second data previously stored in memory cells and to output comparison data through corresponding one internal I/O line among the internal I/O lines, selected based on chip identification (ID) information.

12. The multi-chip package of claim 11, wherein each of the memory chips comprises:
    a memory cell array including first memory cells for storing the second data and second memory cells for storing the chip ID information;
    a data comparison circuit configured to compare the first data and the second data outputted from the first memory cells and to generate comparison data in a test mode operation; and
    output circuits configured to output the comparison data received from the data comparison circuit,
    wherein the comparison data is outputted through an output circuit selected by an enable signal generated based on the chip ID information, from among the output circuits.

13. The multi-chip package of claim 12, wherein the memory chip further comprises a control circuit configured to generate the enable signal and output the enable signal to the selected output circuit.

14. The multi-chip package of claim 13, wherein the control circuit is configured to output the enable signal to input circuits so that the second data is outputted to the page buffer group and the data comparison circuit.

15. The multi-chip package of claim 13, wherein in a normal mode of the memory chips, the control circuit is configured to output the enable signal to the output circuits.

16. The multi-chip package of claim 12, wherein the memory chip further comprises a page buffer group configured to store the second data and the chip ID information to be stored in the first and second memory cells or to store the second data and the chip ID information outputted from the first and the second memory cells, and to output the second data outputted from the first memory cells to the data comparison circuit.

17. The multi-chip package of claim 16, wherein the memory chip further comprises input circuits configured to receive the first data in parallel and to output the first data to the page buffer group and the data comparison circuit.

18. The multi-chip package of claim 17, wherein the memory chip further comprises a control circuit configured to generate the enable signal and output the enable signal to the selected output circuit.

19. The multi-chip package of claim 18, wherein the control circuit is configured to output the enable signal to the input circuits so that the first data is outputted to the page buffer group and the data comparison circuit.

20. The multi-chip package of claim 16, wherein in a normal mode of the multi-chip package, the page buffer group is configured to output data outputted from the first memory cells to the output circuits.

21. The multi-chip package of claim 18, wherein in a normal mode of the multi-chip package, the control circuit is configured to output the enable signal to the output circuits.

22. The multi-chip package of claim 11, wherein said each memory chip is configured to store the second data in the memory cells and compare the second data of the memory cells with the first data to determine whether said each memory chip passes a test.

23. The multi-chip package of claim 11, wherein said each memory chip includes a comparison circuit to determine whether a bit of the first data is consistent with a corresponding bit of the second data of the memory cells, where the determination is made for all of the bits of the first data and the second data.

24. A method of operating a multi-chip package, comprising:
   inputting first data to a plurality of memory chip in parallel;
   performing a program operation for storing the first data in memory cells of said each of the memory chips as second data;
   performing a read operation for reading the second data of the memory cells;
   in a test operation, outputting comparison data obtained by comparing the first data with the second data of the memory cells, through one output circuit selected among the output circuits for said each of the memory chips so that a plurality of the comparison data for the memory chips are outputted; and
   determining whether a test operation for each of the memory chips is a pass or a fail based on the outputted data.

25. The method of claim 24, wherein in outputting the comparison data, the comparison data is provided to the output circuits in parallel.

26. The method of claim 24, wherein the output circuits are selected based on chip identification (ID) information.

27. The method of claim 24, wherein if a fail memory chip is detected as a result of the test operation, the test operation is separately performed for each of the memory chips.

28. The method of claim 24, wherein the output circuits are configured to output the second data of the memory cells is output as output data without the comparison with the first data during a normal operation of the multi-chip package.

* * * * *